United States Patent [19]
Azuma

[11] Patent Number: 5,645,976
[45] Date of Patent: Jul. 8, 1997

[54] CAPACITOR APPARATUS AND METHOD OF MANUFACTURE OF SAME

[75] Inventor: Masamichi Azuma, Colorado Springs, Colo.

[73] Assignee: Matsushita Electronics Corporation, Takatsuki, Japan

[21] Appl. No.: 286,801

[22] Filed: Aug. 4, 1994

Related U.S. Application Data

[62] Division of Ser. No. 136,029, Oct. 14, 1993, abandoned.

[51] Int. Cl.⁶ .................................................. G03F 7/00
[52] U.S. Cl. .......................... 430/313; 430/311; 430/318; 430/329; 430/330
[58] Field of Search ............................. 430/311, 313, 430/314, 318, 319, 329, 330, 396

[56] References Cited

U.S. PATENT DOCUMENTS

| | | | |
|---|---|---|---|
| 4,471,405 | 9/1984 | Howard et al. | 361/305 |
| 4,946,710 | 8/1990 | Miller et al. | 427/126.3 |
| 5,005,102 | 4/1991 | Larson | 361/313 |
| 5,046,043 | 9/1991 | Miller et al. | 365/145 |
| 5,053,917 | 10/1991 | Miyasaka et al. | 361/321.5 |
| 5,112,440 | 5/1992 | Banks | 430/318 |
| 5,191,510 | 3/1993 | Huffman | 361/313 |
| 5,212,620 | 5/1993 | Evans, Jr. et al. | 361/313 |
| 5,248,564 | 9/1993 | Ramesh | 257/295 |
| 5,262,920 | 11/1993 | Sakuma et al. | 361/321.5 |

*Primary Examiner*—Kathleen Duda
*Attorney, Agent, or Firm*—Amster Rothstein & Ebenstein

[57] ABSTRACT

A method for fabricating a semiconductor capacitor having superior sidewall linearity and high capacitance in a small area wherein a titanate or tantalum barrier metal platform is deposited on the insulation layer of the semi conductor substrate. A capacitor structure comprising a first electrode layer of platinum or palladium, a dielectric layer preferably of a ferroelectric having a perovskite structure, and a second metal electrode layer is then constructed by sequential deposition of said layers. The subsequently deposited electrode metal of platinum or palladium will adhere to said barrier metal but delaminate from said insulation layer during high temperature cycling, yielding a high capacitance, small surface area structure.

13 Claims, 3 Drawing Sheets

CAPACITOR APPARATUS AND METHOD OF MANUFACTURE OF SAME

This is a divisional of application Ser. No. 08/136,029 filed on Oct. 14, 1993 now abandoned.

FIELD OF THE INVENTION

The present invention relates to a method and structure for providing a high capacitance structure in a small area. More particularly, a superior platinum-dielectric-platinum capacitor structure is taught along with the processing steps for fabrication thereof.

BACKGROUND OF THE INVENTION

In the art of semiconductor circuit manufacture, it is desirable to provide very fast components in the smallest total area. When fabricating such circuitry, limitations to the optimal size are encountered not only as a result of the physical constraints imposed by equipment and processing capabilities but also as a result of the inherent physical properties of the materials and their properties under the conditions encountered during processing. Ideal combinations of materials have been theorized, given their physical and electrical properties; but the actual fabrication of components utilizing those combinations frequently cannot be realized. Factors which contribute to constraints on fabrication include adhesion of desired electrode and dielectric materials to the substrate materials and to other adjacent layer materials, temperature stability given the processing requirements of the related materials, chemical processing stability, deposition and etching processing requirements for the individual material and, of course, electrical compatibility of the materials.

Specifically in the fabrication of capacitor structures, one successively deposits films of a conductive material comprising a first electrode, a dielectric material sandwich layer, and a second layer of conductive material comprising the second electrode. Necessarily, as discussed above, achieving the desired dimensions in both film thickness and capacitor width is challenging. Processing techniques for both the deposition and removal of films are well known, however, depositing the desired combination of conductor-dielectric-conductor films within the desired tolerances is not always possible.

A known combination of materials for semiconductor capacitor structures is detailed in U.S. Pat. No. 5,046,043 of Miller et al wherein a thin film ferroelectric layer, such as PbTiO, is sandwiched between two electrode layers, of platinum for example. Additional Miller et al patents, specifically U.S. Pat. Nos. 4,946,710 and 5,046,043 set forth methods for preparing and fabricating thin films of ferroelectric dielectric layers for use in semiconductor capacitor structures. Although the Miller teachings do provide improved sol gel methods for depositing thin films, the thin film deposition process is merely one aspect of the total fabrication process for creating the desired capacitor structure. One cannot obtain the ideal tolerances for a platinum-ferroelectric-platinum capacitor structures merely by following the Miller teachings, alone or in combination with other available teachings for capacitor manufacture.

It is, therefore, one of the objectives of the present invention to provide a superior capacitor structure.

It is a further objective of the invention to provide a method for fabricating a superior capacitor structure.

It is yet another objective of the invention to provide a high capacity structure in a small area on a semiconductor substrate.

SUMMARY OF THE INVENTION

These and other objectives are realized by the present invention wherein a platinum-dielectric film-platinum capacitor structure is fabricated on a silicon or gallium arsenide substrate using a perovskite adhesion layer deposited on silicon oxide. The perovskite adhesion layer, such as a lead titanate layer, provides for adhesion of the platinum to a specific area while the platinum is selectively removed from the surrounding surface.

BRIEF DESCRIPTION OF THE INVENTION

The invention will be described in further detail with reference to the Figures wherein.

DETAILED DESCRIPTION OF THE PREFERRED EMBODIMENT

Figure 1A:
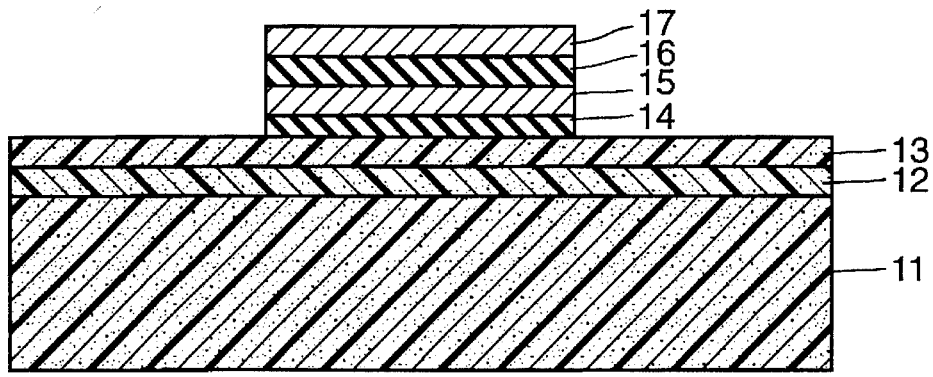
FIGS. 1A and 1B illustrate the inventive capacitor structure fabricated on substrates of gallium arsenide and silicon, respectively.
Figure 1B:
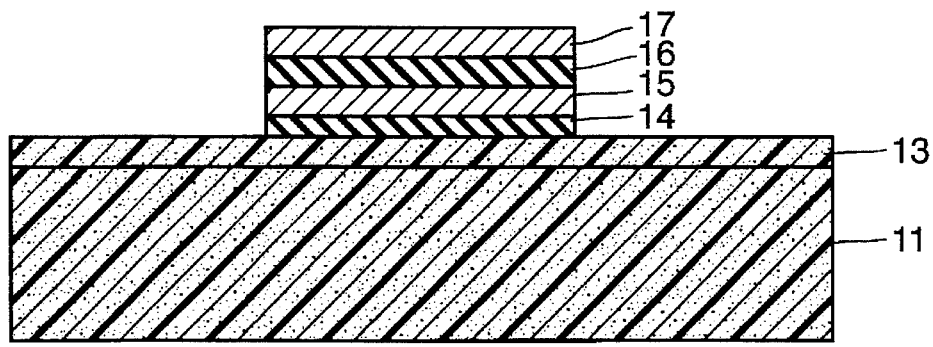

The capacitor structure, in accordance with the present invention, comprises an electrode-dielectric-electrode structure deposited over a selectively deposited barrier metal adhesion layer, all of which overlays at least one adhesion/diffusion barrier layer on a substrate, as shown in FIGS. 1A and 1B. As illustrated, the capacitor structure has superior sidewall linearity due to the improved process flow, which is an additional subject of the invention. Although capacitor structures taught in the art are ideally illustrated as having vertical sidewalls, the reality of the processing is that the various processing steps cannot produce a structure having the profile shown in FIGS. 1A and 1B. As discussed above, the materials and processing constraints limit the composition of the fabricated capacitors, the fabrication capabilities and, thereby, the profile of the resulting structure.

Preferred substrate materials include silicon, gallium arsenide, quartz, ceramics and glass ceramics. For most semiconductor device applications, a substrate of either silicon or gallium arsenide is preferred, given the electrical and physical properties of the materials. Generally, prior to device fabrication on the silicon or gallium arsenide substrate, a conformal layer is deposited to provide a good adhesion layer as well as a diffusion barrier to protect the underlying substrate from chemicals and processes used in the subsequent fabrication steps. Silicon oxide, $SiO_2$, is the preferred material to be deposited over the entire substrate surface prior to fabrication of the capacitor. An SiO layer is commonly used as both an adhesion promoter and diffusion barrier for silicon and gallium arsenide substrates due to its stability and compatibility in terms of processing stability (e.g., expansion, adhesion, dielectric integrity, etc.) to the substrate materials. As is well-known in the art, an intermediate adhesion layer of silicon nitride is needed between a GaAs substrate and a $SiO_2$ layer, whereas $SiO_2$ can be deposited directly onto a silicon substrate.

The present invention further includes a barrier metal adhesion layer selectively deposited on a portion of the $SiO_2$ layer, prior to the first capacitor fabrication step of depositing the first electrode. The requirements for the barrier metal include thermal stability through high temperature cycles and the material limitation that there is no possibility of contamination of the silicon, or GaAs, devices throughout the process. The thermal stability requirement for the barrier metal includes not only a high melting point but also adhesive stability under high temperature conditions with respect to adhering to the underlying silicon oxide layer and the overlying electrode layer. Further, the electrical properties must be thermally stable so that the conductivity of the metal does not degrade as a result of the post-deposition high temperature processing. Specific materials which exhibit these properties include lead titanate, tantalum, titanium silicide and tantalum silicide.

The preferred electrode material is one which exhibits superior electrical properties, specifically conductivity, and which adheres to the barrier metal adhesion layer. Moreover, the electrode material is chosen to exhibit poor adhesion to the surface upon which the barrier metal is deposited (i.e., $SiO_2$), particularly under the high temperature conditions encountered during processing. Electrode materials of choice include platinum and palladium, each of which adhere well to the aforementioned barrier metals. Moreover, platinum and palladium each display inferior adhesion to silicon oxide during high temperature processing and will peel off of a silicon oxide layer at high temperatures, which is particularly significant for the first, or lower, electrode. The second, or upper, electrode may be chosen from the group comprising platinum, palladium, tantalum, tantalum nitride, tungsten, aluminum or molybdenum, since the processing requirements are less stringent for the upper electrode.

The dielectric sandwich layer deposited intermediate the electrode layers is chosen to be electrically (e.g., dielectric constant of less than or equal to 10), thermally (e.g., thermally stable to 800° C.), and adhesively compatible with the electrode metal. With platinum or palladium, a dielectric sandwich layer of a ferrodielectric material in perovskite structure is preferable, including lead titanate, lead titanate doped with niobium or manganese, lead zirconate titanate, lanthanum-doped lead zirconate titanate, strontium titanate, barium strontium titanate, and lead niobate, among others.

The structure and method are further described with specific reference to materials and processing techniques which are well known in the semiconductor processing technology. Clearly, equivalent materials and processing techniques may be substituted, and the related parameters adjusted as is well within the purview of one having skill in the art, while still practicing the invention as herein described and claimed. In the interest of fully disclosing, yet not unduly complicating the disclosure of the present invention, only one material and/or process will hereafter be noted, with the understanding that all equivalents are contemplated thereby.

The structure of the present invention will now be further described with specific reference to FIGS. 1A and 1B. FIG. 1A is a sectional view of one embodiment of the capacitor apparatus of the present invention. As illustrated therein, the surface of a gallium arsenide (GaAs) substrate, 11, is coated with a first film of silicon nitride ($Si_3N_4$), 12, and a second film of silicon oxide ($SiO_2$), 13. The silicon oxide has a titanate film, 14, selectively formed on the silicon oxide surface. The width of the deposited titanate film, 14, is the width of the capacitor structure to be completed. It is on the titanate film, 14, that the capacitor is formed, comprising a first platinum film, 15, as the lower electrode, a lead titanate film, 16, as the dielectric film, and a second platinum film, 17, as the upper electrode. The adhesion layer of silicon nitride is provided to promote the adhesion of silicon oxide to the gallium arsenide substrate. Gallium Arsenide is preferred as a substrate for many applications given its superior compatibility with a variety of materials, such as Cie, Au, etc., and stability in fabricated devices. The subsequently deposited layer of silicon oxide is preferred as the surface onto which the capacitor structure will be formed given the superior adhesive properties of silicon oxide, among the other advantages discussed above.

FIG. 1B illustrates the same capacitor structure formed on a silicon substrate. The only difference between the Si and the GaAs structures is the elimination of the silicon nitride adhesion layer 12 between the substrate 11 and the silicon oxide layer 13 when using a Si substrate, since one does not require the additional adhesion promoting layer between the Si and $SiO_2$.

The dielectric constant of the lead titanate film is 1000–2000, which is more than 100 times that of a conventional silicon oxide or silicon nitride diffusion barrier/adhesion layer. As such, the illustrated capacitor structure provides a tremendously large capacitance in a small area. Furthermore, the first platinum film has a high adhesion to the underlying substrate structure since it is formed on the titanate film, and the adhesion is not compromised thermally by the heat treatments necessary to remove the platinum from other surfaces of the substrate structure.

The method for fabricating the capacitor structure of the present invention is illustrated in FIGS. 2A–2H. The processing steps are illustrated and will be discussed with specific reference to such fabrication on a GaAs substrate. It will be apparent to one having skill in the art that the processing steps will be the same for another choice of substrate, with such minor modification as would be required by the materials and which would be readily implemented by one skilled in the semiconductor fabrication technology. And further, as noted above, obvious equivalents for materials and processing are envisioned although not specifically recited herein. For example, ferroelectric materials may be deposited by spinning, sputtering, chemical vapor deposition (CVD), ion beam sputtering, laser beam deposition, molecular beam epitaxy (MBE) and evaporation.

Figure 2A:
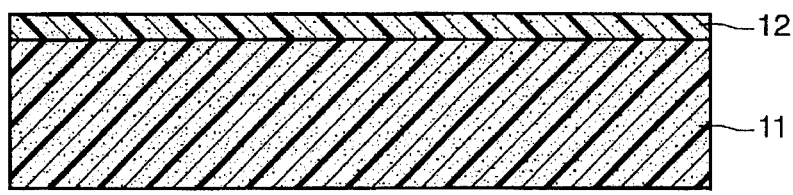
FIGS. 2A-2H illustrate the inventive process flow utilized in fabricating a semiconductor capacitor structure.
Figure 2B:
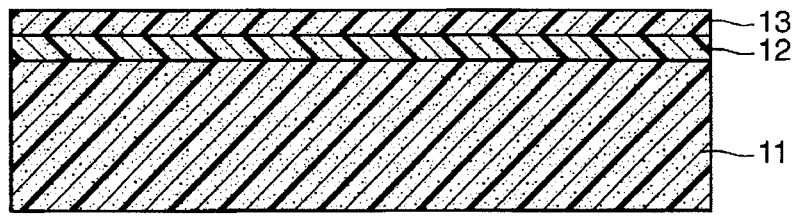

With specific reference to FIGS. 2A–2H, a silicon nitride film, 12, is deposited on the GaAs substrate in a film thickness of 150 nm to 200 nm. Plasma enhanced chemical vapor deposition, conducted at a temperature of 150° C. to 170° C., is the preferred deposition technique for the silicon nitride film, 12 at FIG. 2A. Upon deposition of the silicon nitride, chemical vapor deposition (CVD) is then used to deposit a film of silicon oxide, 13, at a thickness of 200 nm to 500 nm, as shown in FIG. 2B. The CVD processing temperature for the silicon oxide layer is in the range of 300° C. to 450° C. If one is implementing the present invention on a silicon substrate, there is no need to provide a film of silicon nitride on the substrate surface prior to depositing the film of silicon oxide, since the silicon oxide will adhere splendidly to the silicon substrate, whereas an intermediate layer of silicon nitride is necessary to promote the adhesion between the GaAs and the silicon oxide layer. A silicon oxide layer, in the range of 500–800 nm, may be used with the silicon substrate as a silicon-metal insulator.

Figure 2C:
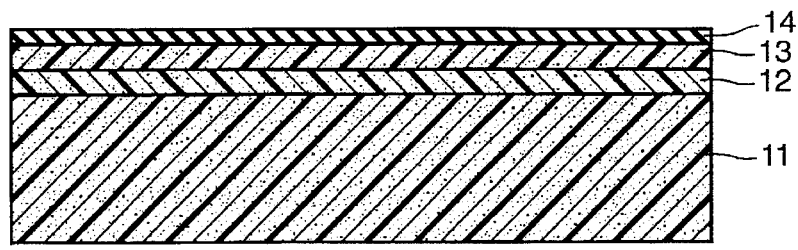
Figure 2D:
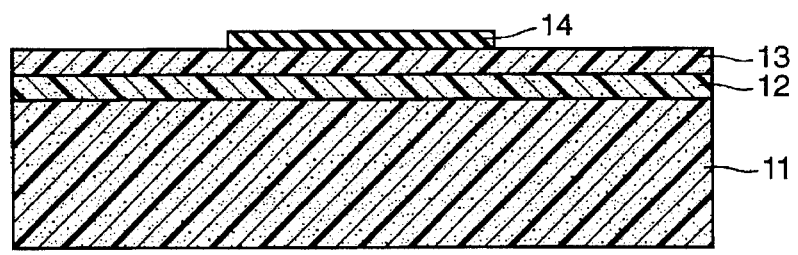

By sputtering, for example, titanate film 14 of FIG. 2C is deposited at room temperature at a film thickness of 10–30 nm. Thereafter, a resist layer is deposited and patterned by photolithography, as is well-known in the art. Clearly, either a positive or a negative resist material and corresponding dissolution chemicals may be used provided that the materials do not adversely affect the substrate and previously deposited layers. Once the resist pattern is formed in the desired dimensions of the finished capacitor, the titanate film is etched through the resist pattern by a dry etching method which will, necessarily, etch only the titanate without affecting the resist material. The resultant structure, wherein the remaining titanate film 14 covers an area which encompasses the surface area in the dimension of the desired capacitor, is illustrated in FIG. 2D.

Figure 2E:
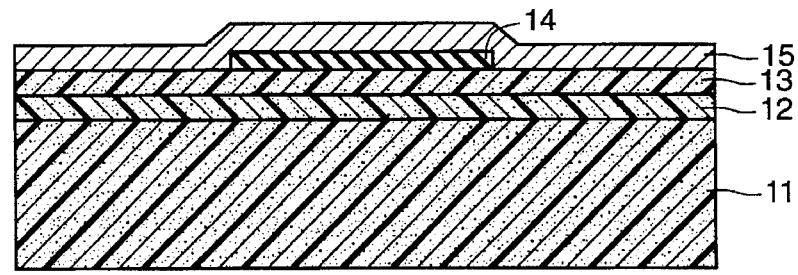
Figure 2F:
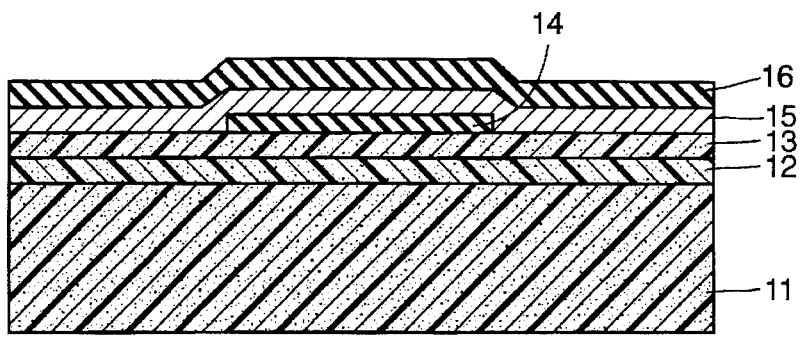
Figure 2G:
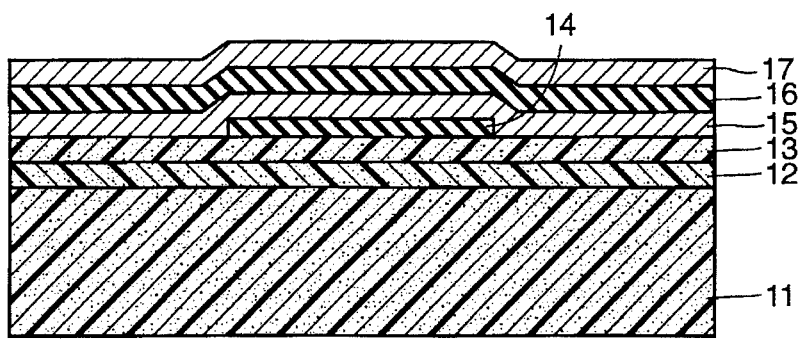

After removal of the resist, a first platinum film, 15, is conformally deposited in a film thickness of 80–300 nm, by sputtering at room temperature, yielding the structure as illustrated in FIG. 2E. Thereafter, alkoxides of a lead titanate are applied, at 16, optimally by rotation using a spinner. The deposited alkoxide film is baked in an atmosphere of Air, $N_2$ or Ar (with a dry gas ambient being preferable) for a period of 2 to 3 minutes at a temperature of about 150° C., resulting in a lead titanate film as illustrated in FIG. 2F. A second platinum film is then formed on the titanate layer in a film thickness of 150–200 nm by sputtering at room temperature. FIG. 2G illustrates the resulting structure.

Figure 2H:
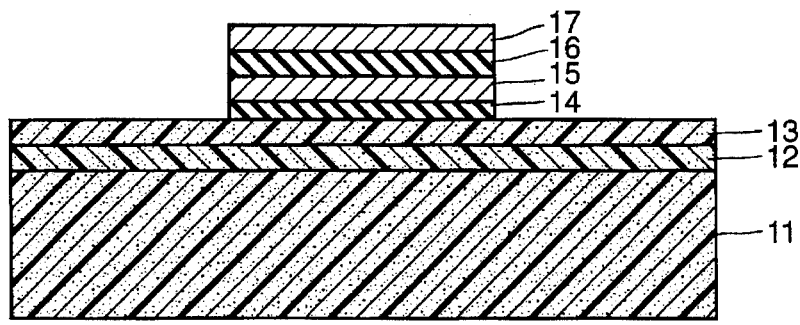

After the second electrode deposition, annealing is performed for 1–2 hours in an oxygen atmosphere at a temperature of between 600° C. to 650° C. The cohesion efficiency of the first platinum film 15 and the silicon oxide film is poor at temperatures above 300° C. Therefore, as a result of the annealing treatment, the first platinum film 15, in the regions for which the platinum is directly overlying silicon oxide, peels off, taking with it the lead titanate film 16 and the second platinum film 17 deposited thereon. The platinum-lead-titanate-platinum will not be removed in the region wherein the titanate layer 14 is the subsurface, as shown in FIG. 2H, due to the superior adhesion between the titanate and the platinum.

If desired, the annealing treatment may be followed by a cleaning process such as an ultrasonic acetone rinse whereby the peelings, including the first platinum 15, lead titanate 16 and second platinum 17, may be completely removed from the SiO surface 13.

The resulting capacitor provides a large capacitance in a smaller area than could previously be achieved with the prior art structures and fabrication techniques. Although the properties of the capacitor depend on the actual dimensions, including layer thicknesses and overall surface area of the capacitor, a capacitor made in accordance with the foregoing description, having dimensions of 1,000–20,000 nm by 180–500 nm and being 180–500 nm in height should exhibit a capacitance of 17.7 fF –.

Although several specific embodiments of the invention have been described and illustrated herein, it will be understood that the invention is not limited to the disclosed embodiments. A user may implement such modifications and substitutions as are known to one having skill in the art without departing from the spirit and scope of the present invention.

What is claimed is:

1. A method of manufacturing a capacitor on a substrate comprising the steps of:

forming an insulation layer on the surface of said substrate, selectively forming a layer of barrier metal on a portion of said insulation layer; and sequentially depositing a first metal electrode, a dielectric thin film and a second metal electrode on said barrier metal layer;

wherein said forming of said barrier metal layer comprises the steps of:

depositing said barrier metal on the surface of said insulation layer;

depositing a photosensitive resist material on said barrier metal;

selectively exposing a pattern on said photosensitive resist material;

selectively removing said patterned portions of said resist material to expose portions of the underlying barrier metal layer; and selectively removing said exposed portions of the barrier metal layer to expose portions of said insulation layer.

2. A method of manufacturing a capacitor on a substrate comprising the steps of:

forming an insulation layer on the surface of said substrate; selectively forming a layer of barrier metal on a portion of said insulation layer;

sequentially depositing a first metal electrode, a dielectric thin film and a second metal electrode on said portions of said surface having said barrier metal layer and on said insulation layer surface;

removing said sequentially deposited first metal electrode, dielectric thin film and said second metal electrode from said insulation layer by heating to a temperature sufficient to delaminate said first metal electrode from said insulation layer and by ultrasonic rinsing after said heating.

3. A method of manufacturing a capacitor comprising the steps of:

forming an insulation layer;

forming a layer of barrier metal on a selected portion of said insulation layer;

depositing, on the barrier metal layer and portions of said insulation layer, a first metal electrode having substantially good adhesive stability with the barrier metal layer and substantially poor cohesive efficiency with said insulation layer when heated to temperatures above approximately 300° C.;

depositing, on said first metal electrode, a dielectric thin film;

depositing, on said dielectric thin film, a second metal electrode;

heating the deposited first metal electrode, dielectric thin film and second metal electrode to a temperature above approximately 300° C. to bond said barrier metal to said insulating material; and removing, without etching, portions of said first metal electrode, said dielectric thin film and said second metal electrode from those areas where the first metal electrode contacts the insulation layer, thereby forming a capacitor coextensive with the barrier metal.

4. The method of claim 3, wherein said step of heating comprises heating said structure to a temperature of 600° C.

5. The method of claim 3 wherein said step of forming an insulation layer comprises forming said insulation layer on a substrate.

6. The method of claim 3 further comprising the step of forming an intermediate adhesion layer on a substrate and wherein said step of forming an insulation layer comprises forming said insulation layer on said intermediate adhesion layer.

7. The method of claim 3 wherein said insulation layer comprises silicon oxide.

8. The method of claim 3 wherein said barrier metal is lead titanate, tantalum, titania silicide or tantalum silicide.

9. The method of claim 3 wherein said first metal electrode is platinum or palladium.

10. The method of claim 3 wherein said dielectric thin film comprises a ferrodielectric material.

11. The method of claim 10 wherein said ferrodielectric material comprises a perovskite structure.

12. The method of claim 11 wherein said perovskite structure is lead titanate, lead zirconate titanate, lanthanum-doped lead zirconate titanate, strontium titanate, barium strontium titanate or lead niobate.

13. The method of claim 3 wherein said second metal electrode is platinum, palladium, tantalum, tantalum nitride, tungsten, aluminum or molybdenum.

* * * * *